United States Patent
Heffner et al.

(10) Patent No.: US 6,265,237 B1
(45) Date of Patent: Jul. 24, 2001

(54) IN-WAFER TESTING OF DFB SEMICONDUCTOR LASERS

(75) Inventors: William Rudolph Heffner, Lower Heidelberg Township, PA (US); John E. Johnson, New Providence, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/461,947

(22) Filed: Dec. 15, 1999

(51) Int. Cl.⁷ .................................................. H01L 21/00
(52) U.S. Cl. ............................................. 438/24; 148/33.4
(58) Field of Search .................................. 438/16, 17, 18, 438/22, 23, 24, 34, 46, 47; 372/44; 251/48, 80, 96

(56) References Cited

U.S. PATENT DOCUMENTS

| | | | |
|---|---|---|---|
| 5,258,991 | * 11/1993 | Peterson | 372/50 |
| 5,281,829 | * 1/1994 | Chinen | 257/80 |
| 5,285,466 | * 2/1994 | Tabatbale | 372/50 |
| 5,891,746 | * 4/1999 | Kuchta | 438/23 |

* cited by examiner

*Primary Examiner*—Keith Christianson
(74) *Attorney, Agent, or Firm*—Baker & McKenzie

(57) ABSTRACT

A method of manufacturing and testing a laser device that facilitates in-wafer testing of the laser device includes forming the laser device on a wafer and forming a light detecting device on the wafer adjacent to the laser device. The laser device should include a grating. The method further includes causing the laser device to lase while in the wafer and detecting light generated from the laser device with the light detecting device. Finally, the method includes obtaining an electro-optic parameter of the laser device from the detected light.

21 Claims, 1 Drawing Sheet

IN-WAFER TESTING OF DFB SEMICONDUCTOR LASERS

FIELD OF THE INVENTION

The present invention is directed to semiconductor lasers. More particularly, the present invention is directed to the manufacturing and testing of semiconductor optical lasers.

BACKGROUND OF THE INVENTION

All optical communication systems include three major building blocks: a source, an optical fiber, and a detector. The source is usually a semiconductor laser.

A semiconductor laser needs both gain and feedback to operate. A typical laser is manufactured in a semiconductor wafer. When the laser is broken away or "cleaved" from the wafer, cleaved facets are formed on the front and rear of the laser. The cleaved facets provide some or all of the required feedback for the laser. The feedback from the cleaved facets may in some instances be tailored by, for example, adding optical coating.

There are multiple types of semiconductor lasers. One type of laser is referred to as a "Fabry-Perot" laser. A Fabry-Perot laser is a multi-mode laser that receives all of its feedback from its cleaved facets. Another type of laser is referred to as a "Distributed Feedback" ("DFB") laser. FIG. 1 illustrates an example of a typical DFB laser 10. DFB laser 10 includes an active region 16 and front and rear facets 12 and 14. Facet 12 provides a reflection 13 and facet 14 provides a reflection 15. DFB laser 10 further includes a diffractive grating 18. Diffractive grating 18 provides additional reflection 19 and 20. Thus, DFB laser 10 receives feedback from both its facets and diffractive grating. A DFB laser is a single-mode laser.

The spectral properties of a DFB laser are very dependent on the strength of the interaction of the lasing light with the diffractive grating. The strength of the interaction is referred to as KL.

When manufacturing DFB lasers or other electro-optic devices, multiple devices are typically fabricated on a single wafer. Determining the yield of the wafers generally requires a considerable amount of individual device testing to select or screen "good" performing devices from the devices with inadequate performance or, in some cases, higher grade devices from lower grade ones. Currently most of this testing or screening is done on devices after they have been separated from the wafer and, for a DFB laser, considerable amount of device to device variation is introduced by the cleaved facet itself. The individual device testing, often required on 100% of the devices, adds considerable expense to the cost of high performance laser devices.

Reduction in testing time and cost can be achieved by selecting for subsequent processing only the wafers which are likely to provide the higher yields at testing. Time and inventory could be saved in this wafer certification process if the laser devices could be evaluated or sampled while in wafer form, i.e., prior to separation. Unfortunately, wafer level testing has not been well exploited in laser manufacturing because the light that is so important to the electro-optic properties of the laser quality is generally inaccessible until after the devices have been cleaved and separated from the wafer.

Based on the foregoing, there is a need for a method and system that provides testing of lasers before they are separated from the wafer.

SUMMARY OF THE INVENTION

One embodiment of the present invention is a method of manufacturing and testing a laser device that facilitates in-wafer testing of the laser device. The method includes forming the laser device on a wafer and forming a light detecting device on the wafer adjacent to the laser device. The laser device should include a grating. The method further includes causing the laser device to lase while in the wafer and detecting light generated from the laser device with the light detecting device. Finally, the method includes obtaining an electro-optic parameter of the laser device from the detected light.

DETAILED DESCRIPTION

One embodiment of the present invention is a method of fabricating DFB lasers that permits the extraction of several fundamental parameters related to the electro-optic behavior of the DFB lasers while the lasers are still in wafer form. These fundamental parameters can be used both to screen wafers, based on correlations to down-stream testing yields, and provide feedback to previous processing steps weeks earlier than possible for separated lasers.

Examples of electro-optic device parameters that can be obtained from DFB lasers while still on the wafer with the present invention include the light vs. laser current response curve, with accompanying threshold current and slope, and the strength of the interaction of the lasing light and the diffraction, or KL. Previously, it was thought that a cleaved facet was required to get these parameters, and therefore, the lasers must first be removed from the wafer. However, the present invention does not require that the lasers be removed from the wafer.

The present invention recognizes that a lasing threshold can be achieved without reflective facets due to the feedback (reflection) of the imbedded internal grating of a DFB laser. The present invention utilizes an adjacent device in the wafer such as a laser, modulator or other embedded light-detecting device, as a means of detecting the internal light emitted by the driven DFB laser. The adjacent device needs to be optically connected and have electrical isolation sufficient to allow the separation of the detected current from the drive current.

One embodiment of the invention utilizes the in-wafer threshold parameter as a simple one parameter method for measuring and monitoring the overall quality of the DFB laser device, reflecting the combined effect of grating strength (KL) with laser cavity geometry.

Figure 1:
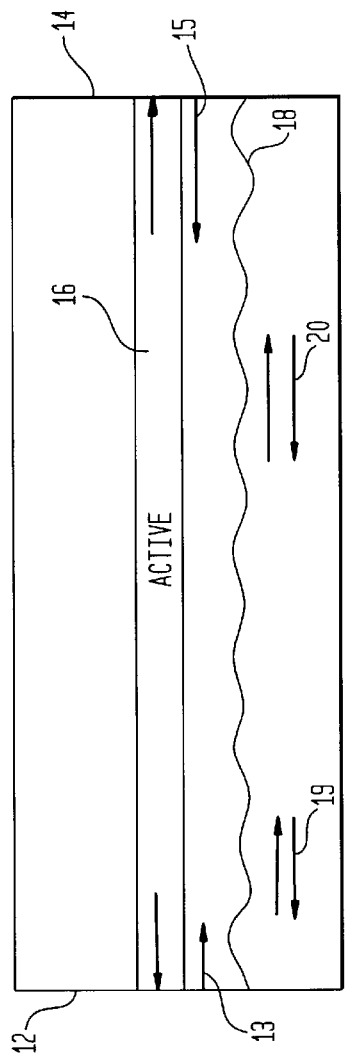
FIG. 1 illustrates an example of a typical DFB laser.
Figure 2:
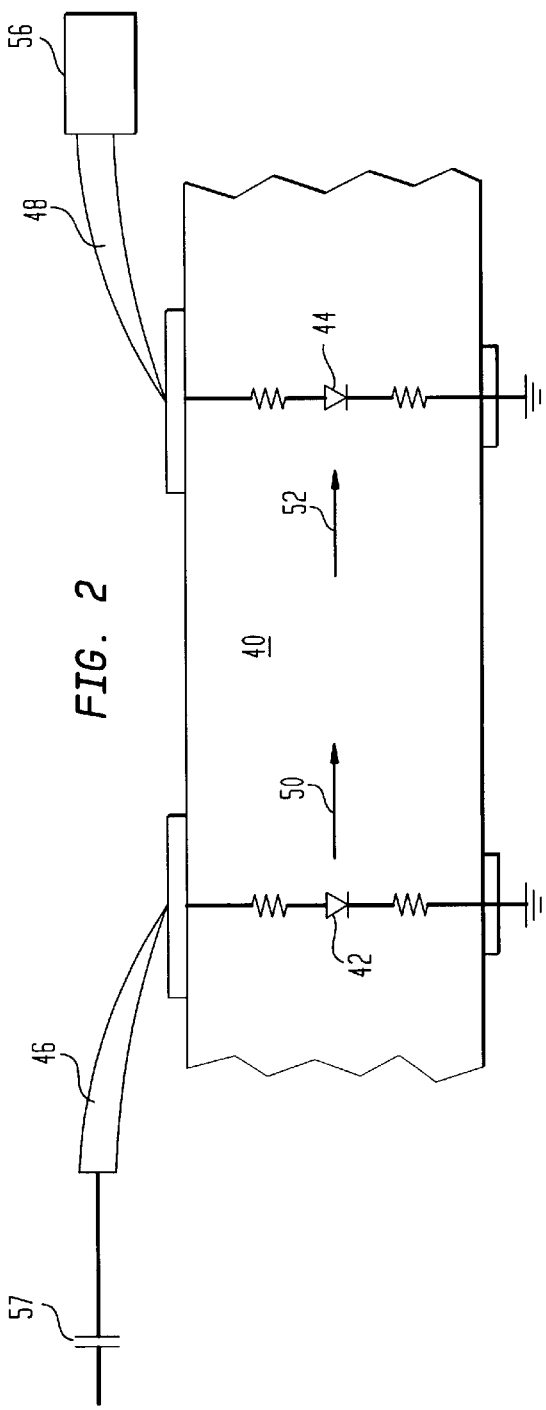
FIG. 2 is a diagram of a wafer in accordance with one embodiment of the present invention.

FIG. 2 is a diagram of a wafer 40 in accordance with one embodiment of the present invention. Wafer 40 includes a DFB laser 42. In other embodiments, laser 42 can be any laser device that has a grating. Wafer 40 also includes a light detecting device 44. Light detecting device 44 can be any electro-optic device that detects light. In one embodiment, device 44 is another laser. In another embodiment, device 44 is a modulator.

A typical wafer, unlike wafer 40, includes multiple laser devices. In accordance with the present invention, each laser device has a corresponding light detecting device.

Coupled to laser 42 is a probe 46. Probe 46 is coupled to a current source 57 which supplies a laser driving current. The laser driving current causes laser 42 to lase and emit a light 50.

A portion of light 50 is received by light detecting device 44 as light 52. Device 44 is coupled to a probe 48 which is coupled to a current detecting monitor 56. Monitor 56 is typically reverse biased. Light 52 causes current to flow from device 44 through probe 48 to current detecting monitor 56. Current detecting monitor 56 can derive useful electro-optic parameters based on the level of detected current. These electro-optic parameters, as discussed, provide information regarding the yield of wafer 40.

In one embodiment, light detecting device 44 is formed on wafer 40 specifically for the purpose of detecting light from laser 42. In other embodiments, light detecting device 44 is formed on wafer 40 for other purposes, but can also be used to detect light in accordance with the present invention. For example, in one embodiment, electro-optically modulated ("EML") lasers are manufactured on wafer 40. Each EML laser comprises a DFB laser and an electrically isolated modulator. In this embodiment, the modulator can be used as the light detecting device to generate useful manufacturing parameters.

In another embodiment, multiple lasers are manufactured on wafer 40. For each laser, an adjacent laser can function as the light detecting device. For best results, the adjacent laser should be partially or fully electrically isolated from the laser that is being tested.

As described, the present invention allows for the testing of a laser device while the laser device is in its respective wafer. An adjacent light detecting device detects light emitted from the tested laser device. The emitted light generates electrical current, and the electrical current is used to generate useful electro-optic parameters.

Several embodiments of the present invention are specifically illustrated and/or described herein. However, it will be appreciated that modifications and variations of the present invention are covered by the above teachings and within the purview of the appended claims without departing from the spirit and intended scope of the invention.

What is claimed is:

1. A method of manufacturing a laser device, said method comprising:
    forming the laser device on a wafer, said laser device having a grating;
    forming a light detecting device on the wafer adjacent to the laser device;
    causing the laser device to lase while in the wafer;
    detecting light generated from the laser device with the light detecting device;
    obtaining an electro-optic parameter of the laser device from the detected light.

2. The method of claim 1, wherein said laser device is a Distributed Feedback laser.

3. The method of claim 1, wherein the light detecting device is a laser.

4. The method of claim 1, wherein the light detecting device is a modulator.

5. The method of claim 1, wherein the light detecting device is electrically isolated from the laser device.

6. The method of claim 1, wherein said electro-optic parameter is a light vs. laser current response curve.

7. The method of claim 1, wherein said electro-optic parameter is KL.

8. The method of claim 1, further comprising the step of:
    generating electrical current in response to the detected light.

9. A semiconductor wafer comprising:
    a first laser device having a grating;
    a first light detecting device optically coupled to said first laser device;
    an electrical current source coupled to said first laser device; and
    a current detecting monitor coupled to said first light detecting device.

10. The semiconductor wafer of claim 9, further comprising:
    a second laser device having a grating; and
    a second light detecting device optically coupled to said second laser device.

11. The semiconductor wafer of claim 9, wherein said first laser device is a Distributed Feedback (DFB) laser.

12. The semiconductor wafer of claim 9, wherein said first light detecting device is a laser.

13. The semiconductor wafer of claim 9, wherein said first light detecting device is a modulator.

14. The semiconductor wafer of claim 9, wherein said first light detecting device is electrically isolated from said first laser device.

15. The semiconductor wafer of claim 9, wherein said current detecting monitor is adapted to generate an electro-optic parameter of said first laser device based on light detected by said first light detecting device.

16. A method of testing a semiconductor laser device having a grating while the laser device is on a wafer, said method comprising:
    generating light from the laser device;
    detecting the light at a light detecting device that is on the wafer;
    receiving electrical current from the light detecting device based on an amount of light detected; and
    generating one or more electro-optic parameters of the laser device from the electrical current.

17. The method of claim 16, wherein said electro-optic parameters comprise a light vs. laser current response curve.

18. The method of claim 16, wherein said electro-optic parameters comprise KL.

19. The method of claim 16, wherein said laser device is a Distributed Feedback laser.

20. The method of claim 16, wherein said light detecting device is a laser.

21. The method of claim 16, wherein the light detecting device is a modulator.

* * * * *